United States Patent [19]
Corisis

[11] Patent Number: 5,818,698
[45] Date of Patent: Oct. 6, 1998

[54] METHOD AND APPARATUS FOR A CHIP-ON-BOARD SEMICONDUCTOR MODULE

[75] Inventor: David J. Corisis, Meridian, Id.

[73] Assignee: Micron Technology, Inc., Boise, Id.

[21] Appl. No.: 541,276

[22] Filed: Oct. 12, 1995

[51] Int. Cl.$^6$ .................................................. H01L 27/00
[52] U.S. Cl. ...................... 361/760; 361/761; 361/764; 361/783; 257/684; 257/723; 257/782; 257/786; 174/260; 438/107
[58] Field of Search .................................... 361/760, 761, 361/764, 783; 257/782, 784, 786, 787, 788, 789, 684, 700, 723, 724; 174/52.2, 52.3, 260, 261, 52.436, 361, 257; 437/209, 211; 438/106, 107, 125

[56] References Cited

U.S. PATENT DOCUMENTS

| | | | |
|---|---|---|---|
| 4,598,308 | 7/1986 | James et al. | 361/764 |
| 5,107,328 | 4/1992 | Kinsman | 257/782 |
| 5,240,588 | 8/1993 | Uchida | 438/125 |
| 5,243,497 | 9/1993 | Chiu | 361/764 |
| 5,313,096 | 5/1994 | Eide | 257/784 |
| 5,384,689 | 1/1995 | Shen | 361/761 |
| 5,502,289 | 3/1996 | Takiar et al. | 361/783 |

*Primary Examiner*—Leo P. Picard
*Assistant Examiner*—John B. Vigushin

[57] ABSTRACT

A semiconductor apparatus and method of manufacture therefor comprises a printed circuit board (PCB) having a plurality of pads with each pad adapted to receive a bond wire and a plurality of holes through the PCB. The apparatus further comprises a semiconductor die associated with each hole, each semiconductor die having a circuit side with bond pads on the circuit side, wherein the circuit side of each said die is attached to the printed circuit board. The apparatus also comprises a plurality of bond wires each having first and second ends, wherein the first end is attached to one of the bond pads and the second end is attached to one of the PCB pads and each bond wire passes through one of the plurality of holes.

16 Claims, 2 Drawing Sheets

METHOD AND APPARATUS FOR A CHIP-ON-BOARD SEMICONDUCTOR MODULE

FIELD OF THE INVENTION

The invention relates to the field of semiconductor manufacture, and more specifically to a method and apparatus for forming a particular arrangement of a printed circuit board and a semiconductor die.

BACKGROUND OF THE INVENTION

Many types of semiconductor die such as dynamic random access memories (DRAMs), static rams (SRAMs), programmable memories, logic devices, and microprocessors are tested and packaged in a similar manner. After a plurality of semiconductor die are manufactured from a wafer of semiconductor material, a cursory test for functionality is performed on each die. The die are singularized, and those die which passed the cursory test are encapsulated in plastic or encased in a ceramic package. Encapsulated packages comprise bond wires which electrically couple bond pads on the die to a lead frame. The lead frame functions, in part, to transfer an electric signal between the die and a printed circuit board (PCB) to which leads of the lead frame are soldered.

After packaging, the die and package connections are rigorously tested using strict electrical parameters under various environmental conditions. Those which fail testing are scrapped.

The packaging of a semiconductor die has various problems associated therewith. For example the packaging increases the size of the semiconductor device which adds to space problems which are well known in the art of computer and other electronic device manufacturing. Further, packaging can contribute to overheating of the die which can cause the packaged die to malfunction. Connections of the bond wire to the die and to the lead frame, and the solder connections of the leads to the PCB, are also common causes of device failure.

A semiconductor device which has fewer of the problems associated with conventional device packaging would be desirable.

SUMMARY OF THE INVENTION

One embodiment of an inventive semiconductor apparatus comprises a printed circuit board having at least one pad to receive a bond wire, and further having at least one hole therethrough. A circuit side of a semiconductor device having bond pads thereon is attached to the printed circuit board. This embodiment of the inventive apparatus further comprises at least one bond wire having first and second ends, wherein the first end is attached to one of the bond pads and the second end is attached to the printed circuit board pad.

Various objects and advantages will become apparent to those skilled in the art from the following detailed description read in conjunction with the appended claims and the drawings attached hereto.

It should be emphasized that the drawings herein are not to scale but are merely schematic representations and are not intended to portray the specific parameters or the structural details of the invention, which can be determined by one of skill in the art by examining the information herein.

DETAILED DESCRIPTION OF THE INVENTION

Figure 1:
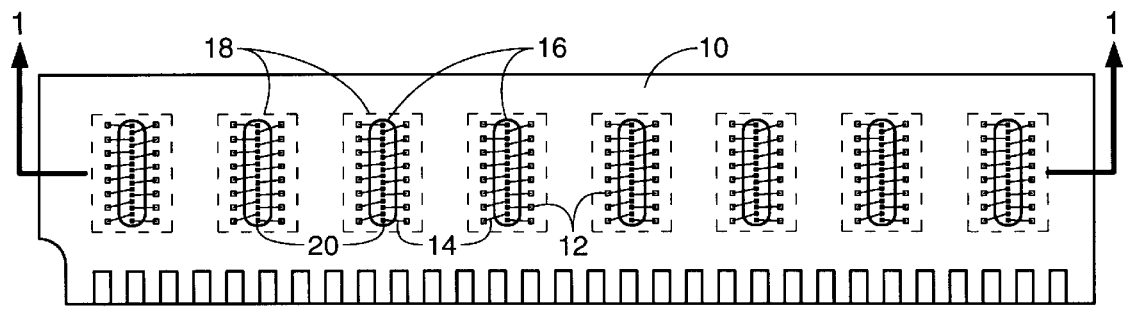
FIG. 1 is a top view of a first embodiment of an inventive semiconductor apparatus.
Figure 2:
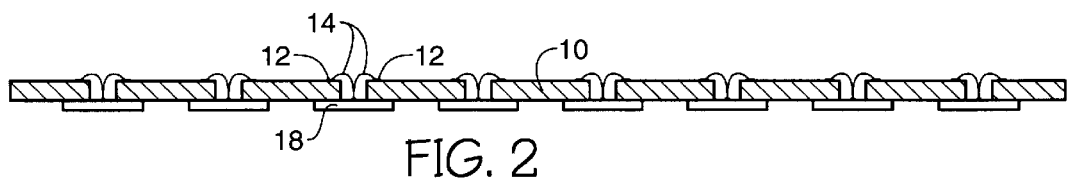
FIG. 2 is a cross section of the FIG. 1 apparatus.

One embodiment of an inventive semiconductor apparatus such as a memory module is shown in FIG. 1 as a top view, and in FIG. 2 as a cross section along "1" of FIG. 1. The semiconductor apparatus comprises a printed circuit board (PCB) 10 having at least one pad 12, or more likely a plurality of pads, adapted to receive a bond wire 14, and further having at least one hole 16 therethrough. The apparatus further comprises at least one semiconductor die 18, or more likely a plurality of die, each having a circuit side with bond pads 20 on the circuit side. The circuit side of the die is attached to the printed circuit board with an adhesive (not shown). Adhesives such as thermoplastic, thermoset, pressure-sensitive tape, or other adhesives known in the art would function sufficiently.

Each bond wire 14 comprises first and second ends. The first end is attached to one of the bond pads, and the second end is attached to one of the printed circuit board pads. FIGS. 1 and 2 show each bond wire passing through a single hole, although other arrangements are possible.

The die 18 can comprise a number of different configurations. Each die shown in FIG. 1 comprises centrally located bond pads, and the PCB comprises one hole for each die. The hole through the PCB allows access to the centrally located bond pads on the die such that the bond wires can be attached thereto.

Figure 3:
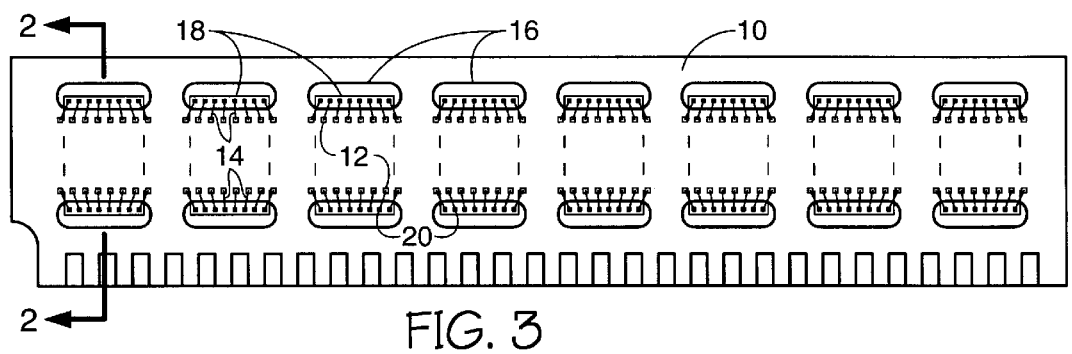
FIG. 3 is a top view of a second embodiment of the inventive semiconductor apparatus.
Figure 4:
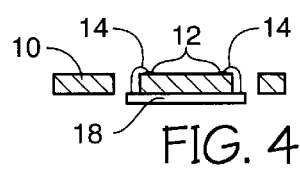
FIG. 4 is a cross section of the FIG. 3 apparatus.

FIG. 3, a top view, and FIG. 4, a cross section along "2" of FIG. 3, show another embodiment of the invention which comprises at least one die, or more likely a plurality of die, each comprising a plurality of bond pads located at first and second ends of each die. The PCB comprises at least one hole for each end of each die to provide access to the bond pads on the die.

Figure 5:
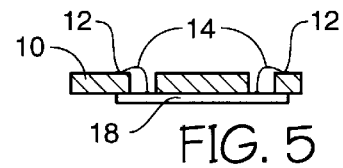
FIG. 5 is a cross section of another embodiment of the inventive semiconductor apparatus.
Figure 6:
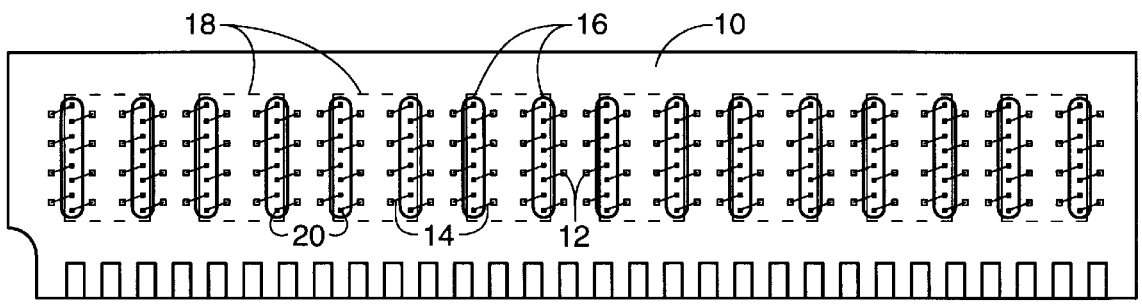
FIG. 6 is a top view of another embodiment of the inventive apparatus.

The bond wires can be connected in directions other than those shown in the FIGS. While FIG. 3 shows the PCB pads toward the center of the PCB, they could also be connected toward the edges of the PCB as shown in FIG. 5, or a combination thereof similar to the arrangement shown in FIG. 6. In addition, while FIGS. 3 and 4 show that the edge of the die is not supported by the edge of the PCB, it may be advantageous to support the edges of the die with the PCB as shown in FIG. 5 if the small dimensions of the die allow. The distance between the edge of the bond pad and the edge of the die is typically about 5 mils.

Figure 7:
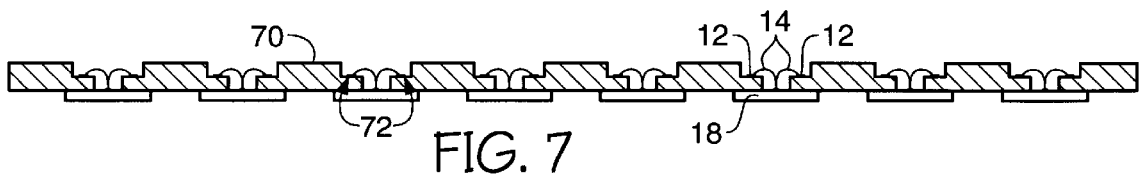
FIG. 7 is a cross section of the FIG. 6 embodiment.

FIG. 7 shows another embodiment of the invention. In this embodiment the PCB has first 70 and second 72 surfaces, with the first surface 70 in a superior plane with respect to the second surface 72. In this embodiment, the PCB pad 12 is on the second surface 72. Placing the bond wires in the arrangement shown protects the bond wires from contact with other conductive surfaces which might short the electrical connection, or with other surfaces which could damage the bond wire or its connection with the PCB pad or bond pad. Additionally, the bond wires can be sealed by filling the hole with a layer of "glob top," encapsulant, or another workable material which protects the bond wires, the die, and the PCB pads from environmental damage, for example from moisture or from physical contact with other surfaces. The protectant can be formed flush with the first surface to provide a flat module.

Figure 8:
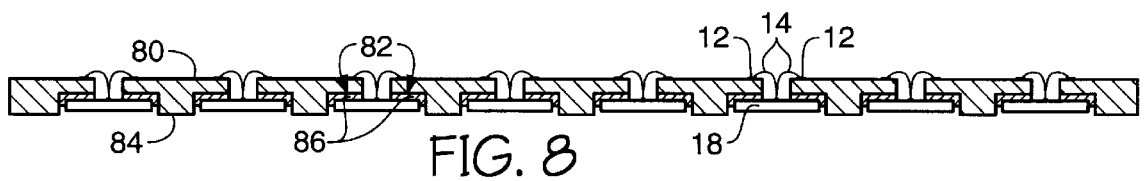
FIGS. 8 and 9 are cross sections of two additional embodiments of the inventive apparatus.

FIG. 8 shows a cross section of another embodiment of the invention comprising first 80, second 82, and third 84 printed circuit board surfaces with the second surface 82 being in a plane between a plane of the first surface 80 and a plane of said third surface 84. In this embodiment, the die is attached to the second surface with an adhesive 86, such as thermoplastic, thermoset, or pressure-sensitive double-sided tape. If an adhesive is used which allows for removal of a die from the PCB without damage to the PCB, a die which becomes nonfunctional can be more easily replaced.

Figure 9:

FIG. 9 shows another embodiment of the invention comprising first 90, second 92, third 94 and fourth 96 PCB surfaces wherein the second 92 and third 94 surfaces are interposed between the first 90 and fourth 96 surfaces, and wherein the second surface 92 is in a superior plane with respect to the third surface 94. In this embodiment, the PCB pad 12 is on the second surface 92 and the die 18 is attached to the third surface 94. This embodiment provides for a flat assembly which may allow for the placement of several assemblies in a small area, or for stacking several modules.

In an inventive method for manufacturing an inventive semiconductor module, a printed circuit board is provided. The PCB comprises a first surface, a second surface opposite the first surface, a plurality of holes through the PCB, and a plurality of pads on the first surface each adapted to receive a bond wire. Further, a plurality of semiconductor die are provided, each die having a circuit side with a plurality of bond pads thereon. The circuit side of each die is attached to the second surface of the PCB and bond wires are attached to a plurality of the pads on the printed circuit board and to a plurality of the bond pads. In one embodiment, each bond wire passes through one of the holes. The bond pads on each of the die can be centrally located as described above, with each bond wire attached to one of the die passing through a single hole. In another embodiment, the bond pads on each of the die are located at first and second ends of the die wherein each bond wire attached to one of the die passes through one of two holes associated with the one die.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, while the FIGS. generally show a single in-line memory module (SIMM), a wide range of other boards, such as computer mother boards, other types of memory modules, or PCBs with two or more types of die, such as a microprocessor, logic devices, and memory can be assembled. Connections other than bond wires could conceivably be used, and the number of holes in the PCB may be more or less than the number shown in the FIGS. for each type of die. It is therefore contemplated that the appended claims will cover any such modifications or embodiments as fall within the true scope of the invention.

What is claimed is:

1. A semiconductor apparatus comprising:
   a printed circuit board having a plurality of bond pads each adapted to receive a bond wire;
   at least first and second semiconductor die each having a circuit side with bond pads on said circuit side located at first and second ends of said die, wherein said circuit side of each said die is attached to said printed circuit board and said printed circuit board further comprises at least one hole for each end of each said die; and
   at least one bond wire for each said die, each said bond wire having first and second ends, wherein said first end is attached to one of said bond pads and said second end is attached to one of said printed circuit board pads.

2. The apparatus of claim 1 further comprising a plurality of said die each comprising a plurality of bond pads, wherein said bond pads on each of said die are located at first and second ends of said die, and said printed circuit board comprises at least one hole for each end of each of said plurality of die.

3. The apparatus of claim 1 further comprising first, second, and third printed circuit board surfaces wherein said second surface is in a plane between a plane of said first surface and a plane of said third surface and said die is attached to said second surface.

4. The apparatus of claim 1 further comprising first, second, third, and fourth printed circuit board surfaces wherein said second and third surfaces are interposed between said first and fourth surfaces and said second surface is in a superior plane with respect to said third surface and said printed circuit board pads are on said second surface and said die is attached to said third surface.

5. A method of manufacturing a semiconductor module comprising the following steps:
   providing a printed circuit board having a first surface, a second surface opposite said first surface, plurality of holes through said printed circuit board, and a plurality of pads each adapted to receive a bond wire;
   providing a plurality of semiconductor die each having a circuit side with a plurality of bond pads thereon at first and second ends of said die;
   attaching said circuit side of each said die to said second surface of said printed circuit board;
   attaching bond wires to a plurality of said pads on said printed circuit board and to a plurality of said bond pads, each said bond wire passing through one of two holes associated with each said die.

6. The method of claim 5 wherein said printed circuit board further comprises a third surface at a level between said first surface and said second surface, wherein said printed circuit board pads are on said third surface.

7. The method of claim 6 further comprising the step of sealing said bond wires after said step of attaching said bond wires.

8. The method of claim 5 wherein said printed circuit board further comprises a third surface at a level between said first surface and said second surface, wherein said circuit side of each said die is attached to said second surface.

9. The method of claim 5 wherein said printed circuit board further comprises third and fourth surfaces each at a level between said first and second surfaces, said third surface being in a superior plane with respect to said fourth surface, wherein said printed circuit board pads are on said third surface and said circuit side of each said die is attached to said fourth surface.

10. The method of claim 9 further comprising the step of sealing said bond wires after said step of attaching said bond wires.

11. A semiconductor apparatus comprising:
   a printed circuit board having at least one hole therethrough and at least two pads each adapted to receive a bond wire, said printed circuit board further having first and second printed circuit board surfaces wherein said first surface is in a superior plane with respect to said second surface and said printed circuit board pads are on said second surface;
   at least one semiconductor die having a circuit side with bond pads located at first and second ends of said circuit side of said die, wherein said circuit side of said die is attached to said printed circuit board;
   at least two bond wires each having first and second ends, wherein said first end of each bond wire is attached to one of said bond pads and said second end is attached to one of said printed circuit board pads;
   wherein said printed circuit board comprises at least one hole therein for each end of each said at least one die.

12. The apparatus of claim 11 further comprising a plurality of said die each comprising a plurality of bond pads, wherein said bond pads on each of said die are centrally located on said die, and said printed circuit board comprises at least one hole for each of said plurality of die.

13. The apparatus of claim 11 further comprising a plurality of said die each comprising a plurality of bond pads, wherein said bond pads on each of said die are located at first and second ends of said die, and said printed circuit board comprises at least one hole for each end of each of said plurality of die.

14. A semiconductor apparatus comprising:
   a printed circuit board comprising first, second, third, and fourth printed circuit board surfaces wherein said second and third surfaces are interposed between said first and fourth surfaces and said second surface is in a superior plane with respect to said third surface, said printed circuit board further comprising at least one pad on said second surface adapted to receive a bond wire and further having at least one hole therethrough;
   at least one semiconductor die having a circuit side with bond pads on said circuit side, wherein said circuit side of said die is attached to said third surface of said printed circuit board;
   at least one bond wire having first and second ends, wherein said first end is attached to one of said bond pads and said second end is attached to said printed circuit board pad.

15. A method of manufacturing a semiconductor module, comprising the following steps:
   providing a printed circuit board having a first surface, a second surface opposite said first surface, a third surface at a level between said first and second surfaces, a plurality of holes through said printed circuit board, and a plurality of pads on said third surface each adapted to receive a bond wire;
   providing a plurality of semiconductor die each having a circuit side with a plurality of bond pads thereon;
   attaching said circuit side of each said die to said second surface of said printed circuit board;
   attaching bond wires to a plurality of said pads of said printed circuit board and to a plurality of said bond pads, each said bond wire passing through one of said holes.

16. A method of manufacturing a semiconductor module comprising the following steps:
   providing a printed circuit board having a first surface, a second surface opposite said first surface, a third surface at a level between said first and second surfaces, a plurality of holes through said printed circuit board, and a plurality of pads on said first surface each adapted to receive a bond wire;
   providing a plurality of semiconductor die each having a circuit side with a plurality of bond pads thereon;
   attaching said circuit side of each said die to said third surface of said printed circuit board;
   attaching bond wires to a plurality of said pads on said printed circuit board and to a plurality of said bond pads, each said bond wire passing through one of said holes.

* * * * *